(12) United States Patent
Strasser et al.

(10) Patent No.: US 7,013,575 B2
(45) Date of Patent: Mar. 21, 2006

(54) POSITION MEASURING DEVICE

(75) Inventors: Erich Strasser, Trostberg (DE); Rudolf Mittmann, Tacherting (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 27 days.

(21) Appl. No.: 10/500,787

(22) PCT Filed: Nov. 30, 2002

(86) PCT No.: PCT/EP02/13547

§ 371 (c)(1),
(2), (4) Date: Jul. 2, 2004

(87) PCT Pub. No.: WO03/060431

PCT Pub. Date: Jul. 24, 2003

(65) Prior Publication Data

US 2005/0072016 A1    Apr. 7, 2005

(30) Foreign Application Priority Data

Jan. 17, 2002   (DE) .............................. 102 01 496
Sep. 23, 2002   (DE) .............................. 102 44 235

(51) Int. Cl.
*G01B 7/02* (2006.01)
(52) U.S. Cl. ...................................... 33/706
(58) Field of Classification Search ............ 33/706, 33/1 PT, 707, 708
See application file for complete search history.

(56) References Cited

U.S. PATENT DOCUMENTS

| | | | |
|---|---|---|---|
| 4,631,519 A | | 12/1986 | Johnston |
| 4,786,891 A | * | 11/1988 | Ueda et al. ................ 33/707 |
| 4,799,798 A | * | 1/1989 | Erb ............................ 33/707 |
| 5,287,630 A | * | 2/1994 | Geisler ...................... 33/706 |
| 5,434,602 A | * | 7/1995 | Kaburagi et al. ........... 33/708 |
| 6,600,308 B1 | * | 7/2003 | Shirai et al. .............. 33/1 PT |
| 6,742,275 B1 | * | 6/2004 | Mayer et al. ............... 33/707 |
| 2004/0216320 A1 | * | 11/2004 | Birrer et al. ............... 33/708 |

FOREIGN PATENT DOCUMENTS

| | | |
|---|---|---|
| GB | 2 126 444 A | 3/1984 |
| WO | WO 02/01160 A1 | 1/2002 |

OTHER PUBLICATIONS

Stevenson, J.T.M. et al. "Absolute Position Measurement Using Optical Detection of Coded Patterns," Journal of Physics E/Scientific Instruments, vol. 21, No. 12, 1988, pp. 1140-1145.

* cited by examiner

*Primary Examiner*—Christopher W. Fulton
(74) *Attorney, Agent, or Firm*—Brinks Hofer Gilson & Lione

(57) ABSTRACT

A position measuring device including a code having a first code element and a second code element arranged one behind the other in a measuring direction, wherein each of the first and second code elements includes a first partial area and a second partial area, which are complementary to each other and are arranged sequentially in the measuring direction. A scanning device including a plurality of detector elements that scan the first and second code elements and for forming a first scanning signal within the first partial area of the first code element and a second scanning signal within the second partial area of the first code element. An evaluation unit including a comparison device, which compares the first scanning signal with the second scanning signal and forms binary information for the first code element as a function of the comparison.

17 Claims, 5 Drawing Sheets

POSITION MEASURING DEVICE

Applicants claim, under 35 U.S.C. §§ 120 and 365, the benefit of priority of the filing date of Nov. 30, 2002 of a Patent Cooperation Treaty patent application, copy attached, Serial Number PCT/EP02/13547, filed on the aforementioned date, the entire contents of which are incorporated herein by reference, wherein Patent Cooperation Treaty patent application Serial Number PCT/EP02/13547 was not published under PCT Article 21(2) in English.

Applicants claim, under 35 U.S.C. § 119, the benefit of priority of 1) the filing date of Jan. 17, 2002 of a German patent application, copy attached, Serial Number 102 01 496.5, filed on the aforementioned date, and 2) the filing date of Sep. 23, 2002 of a German patent application, copy attached, Serial Number 102 44 235.5, filed on the aforementioned date, the entire contents of each of which are incorporated herein by reference.

BACKGROUND OF THE INVENTION

1. Field of the Invention

The present invention relates to a position measuring device for determining the absolute position, as well as a method for absolute position measuring 9.

2. Description of the Related Art

Absolute position measuring devices are increasingly employed in many fields, wherein the absolute position information is derived from a code track with code elements arranged one behind the other in the measuring direction. In this case the code elements are provided in a pseudo-random distribution, so that a defined number of sequential code elements constitutes a bit pattern. In the course of displacing the scanning device with respect to the code track by a single code element, a new bit pattern is already formed, and a sequence of different bit patterns is available over the entire measuring range to be absolutely detected.

Such a sequential code is called a chain code or a pseudo-random code.

It is stated in the publication "Absolute Position Measurement Using Optical Detection of Coded Patterns" by J. T. M. Stevenson and J. R. Jordan in Journal of Physics E/Scientific Instruments 21 (1988), No. 12, pp. 1140 to 1145, that each code element includes a predetermined sequence of two partial areas with optical properties which are complementary to each other.

Reference is made in the publication to GB 2 126 444 A. For generating the binary information in connection with such a Manchester coding, it is proposed there to compare the analog scanning signals of the code areas with a predetermined trigger threshold and to generate a binary information 0 or 1 as a function thereof.

This comparison with a fixedly predetermined trigger threshold has the disadvantage that fluctuations in the analog scanning signals can lead to an erroneous generation of the binary information.

SUMMARY AND OBJECTS OF THE INVENTION

Thus, an object of the present invention is based on creating an absolute position measuring device of high dependability or operational reliability, by which the generation of the absolute position as error-free as possible is therefore possible.

This object is attained by a position measuring device including a code having a first code element and a second code element arranged one behind the other in a measuring direction, wherein each of the first and second code elements includes a first partial area and a second partial area, which are complementary to each other and are arranged sequentially in the measuring direction. A scanning device including a plurality of detector elements that scan the first and second code elements and for forming a first scanning signal within the first partial area of the first code element and a second scanning signal within the second partial area of the first code element. An evaluation unit including a comparison device, which compares the first scanning signal with the second scanning signal and forms binary information for the first code element as a function of the comparison.

A further object of the present invention is based on disclosing a method for determining an absolute position, by which a generation of the binary information, and therefore of the absolute position, as free as possible of errors is made possible.

This object is attained by a method for absolute position measuring that includes scanning a code having a first code element and a second code element arranged one behind the other in a measuring direction, wherein each of the first and second code elements includes a first partial area and a second partial area, which are complementary with respect to each other and are arranged following each other in the measuring direction. Generating a first scanning signal within the first partial area of the first code element and a second scanning signal within the second partial area of the first code element. Comparing the first and second scanning signals with each other and forming binary information from the comparing.

The present invention will be explained in greater detail by the drawings, wherein is shown in:

BRIEF DESCRIPTION OF THE DRAWINGS

FIG. 5b shows possible control signals from the analog scanning signals in accordance with FIG. 5a;

DESCRIPTION OF THE PREFERRED EMBODIMENT(S) OF THE INVENTION

Figure 1:
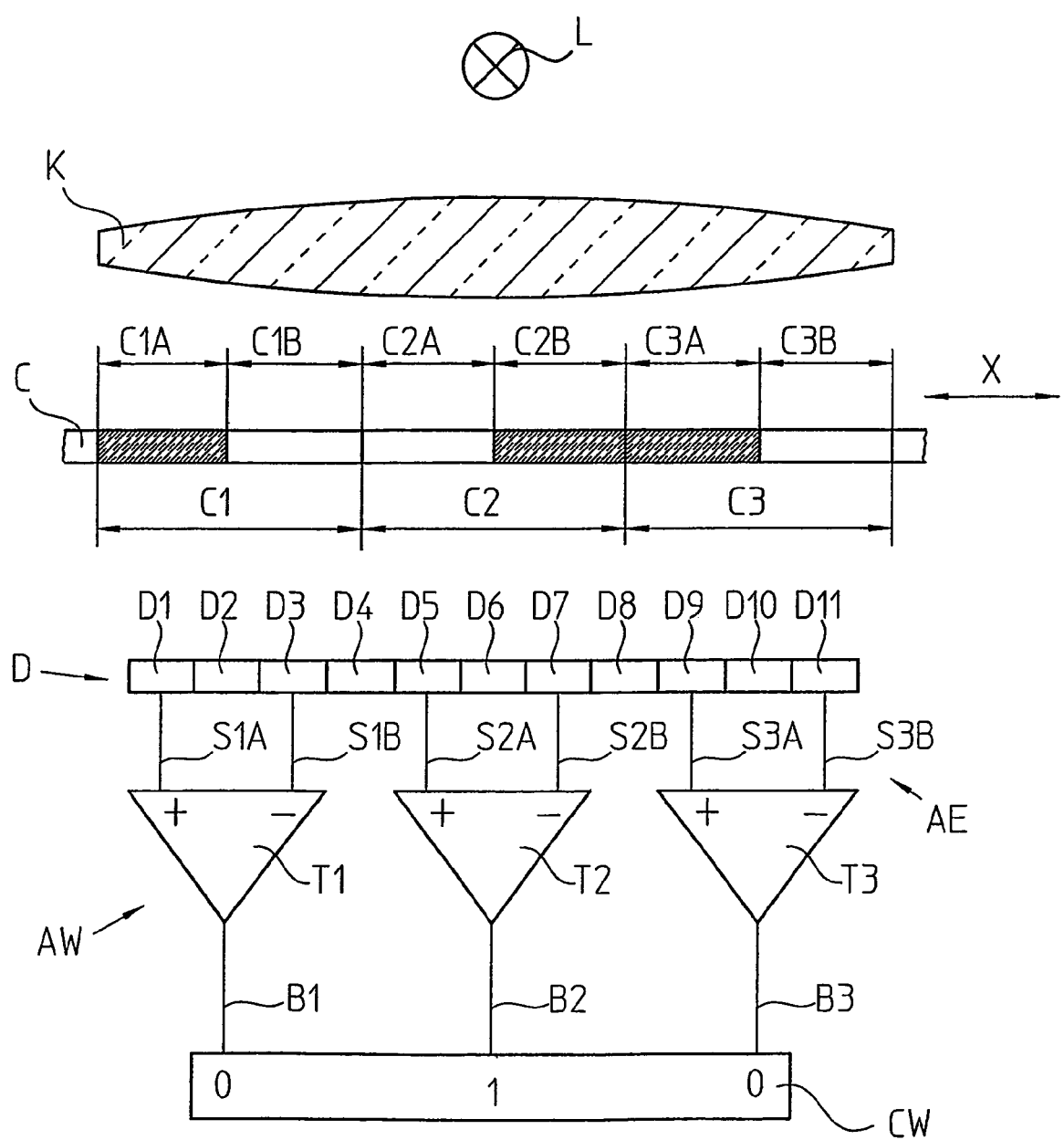
FIG. 1 shows an embodiment of a position measuring device in a schematic representation in accordance with the present invention.

A position measuring device equipped in accordance with the present invention is schematically represented in FIG. 1. This position measuring device operates in accordance with the optical scanning principle, wherein a code C is scanned of the transmitted light method. A scanning device AE arranged, movable in the measuring direction X relative to the code C, is used for scanning the code C.

The code C includes a sequence of code elements C1, C2, C3 of equal length, arranged one behind the other in the measuring direction X. In turn, each code element C1, C2, C3 includes two partial areas A and B of equal length, sequentially arranged in the measuring direction immediately following each other, which are designed complementary to each other. In this case complementary means that they have inverse properties, i.e. in case of an optical scanning principle are transparent or not transparent, or in case of incident light scanning are reflecting or non-reflecting.

The sequential code C is scanned by the scanning device AE, which contains a light source L, whose light illuminates, via a collimator lens K, several code elements C1, C2, C3 following each other. The light is modulated as a function of the position by the code C, so that a position-dependent light distribution is created behind the code C, which is detected by a detector unit D of the scanning device AE.

The detector element D is a line sensor with a sequence of detector elements D1 to D11, which are arranged in the measuring direction X. In each relative position, at least one detector element D1 to D11 is unequivocally assigned to each partial area A, B of the code elements C1, C2, C3, so that in every relative position of the detector unit D with respect to the code C a scanning signal S1A to S3B is obtained from each partial area A, B. These scanning signals S1A to S3B are conducted to an evaluation device AW, which compares each of the two scanning signals S1A, S1B, S2A, S2B, S3A, S3B of the two partial areas C1A, C1B, C2A, C2B, C3A, C3B of a code element C1, C2, C3 with each other and, by its comparison creates a digital value, or a bit B1, B2, B3 for each code element C1, C2, C3. A sequence of several digital values B1, B2, B3 results in a codeword CW, which defines the absolute position. In case of a displacement of the detector unit D with respect to the code C by a width or length of a code element C1, C2, C3, a new code word CW is generated, and a multitude of different code words CW is formed over the measuring area to be absolutely measured.

FIG. 1 shows a momentary position of the code C in relation to the scanning device AE. The detector elements D1 to D11 are arranged in sequence at a distance of one-half the width of a partial area C1A to C3B of the code C. By this it is assured that in each position at least one detector element D1 to D11 is unequivocally assigned to a partial area C1A to C3B and does not scan a transition between two partial areas C1A to C3B. In the position represented, the partial area C1A is scanned by the detector element D1, and the partial area C1B by the detector element D3. The detector elements D1, D3 detect the light distribution and generate, as a function of the light intensity, an analogous scanning signal S1A, S1B. Since the two partial areas C1A and C1B are embodied complementary to each other, the intensity of the scanning signals S1A and S1B is also inverse with respect to each other, therefore the signal levels are distanced far apart from each other.

This signal distance is now utilized for generating the binary information B1 in that a check is made which of the two scanning signals S1A, S1B of the code element C1 is greater. This check can be made by forming a quotient or by forming a difference. Difference formation is used in the example, wherein in accordance with FIG. 1 a trigger module T1 is used as the comparison device. The trigger module T1 generates B1=0, if S1A is less than S1B, and B1=1, if S1A is greater than S1B. In the same way binary information B2 and B3 is obtained by scanning the code elements C2, C3 and comparing the analog scanning signals S2A, S2B, S3A, S3B, and by comparison of the partial areas C2A, C2B, C3A, C3B of respective code elements C2, C3 by trigger modules T2, T3.

Therefore a first digital value is assigned to the first sequence of the partial areas A, B, which are embodied complementary to each other, and a second digital value is assigned to a second sequence of the partial areas A, B, which are embodied complementary to each other. In the example, the value 0 is assigned to the sequence opaque→transparent, and the value 1 to the sequence transparent→opaque.

Since the two partial areas A and B of each code element C1, C2, C3 are complementary to each other, the signal-to-noise ratio of the scanning signals S is very large. A change in the light intensity of the light source L affects the scanning signals S of both partial areas A and B equally.

With the position measuring device correctly operated, because of the complementary embodiment of each of two partial areas A, B of a code element C1, C2, C3, analog scanning signals S, whose difference exceeds a preselected value, must be generated by scanning these partial areas A, B. A good error check is possible by observing this difference value. The basis of this error check is that it is possible to assume that, when the difference value falls by a predetermined value, the binary information B1, B2, B3 is questionable and therefore an error signal F1 is generated in connection with this binary information B1, B2, B3.

Figure 2:
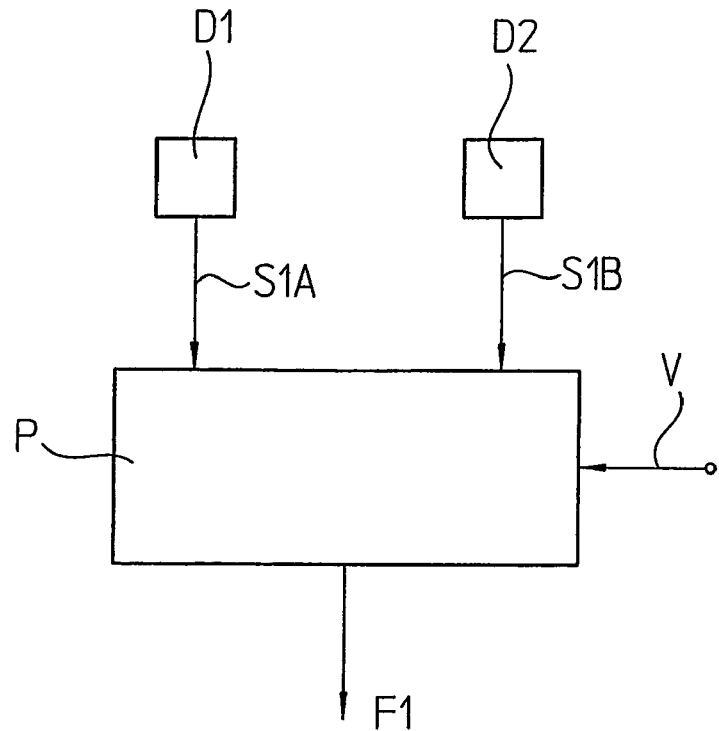
FIG. 2 shows the principle of an embodiment of an error test in accordance with the present invention.
Figure 3:
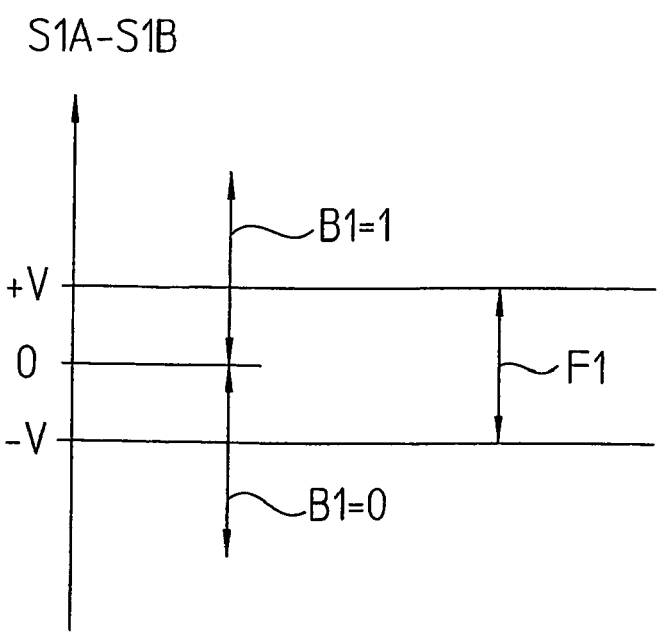
FIG. 3 shows possible signals for error testing in accordance with FIG. 2.

The principle of the generation of the error signal F1 is represented in FIG. 2. The analog scanning signals S1A and S1B of the code element C1 are conducted to an error check device P. The error check device P compares S1A and S1B by forming a difference (S1A−S1B) and checks whether the difference value exceeds a predetermined comparison value V or does not exceed it. If the difference value (S1A−S1B) does not exceed the predetermined comparison value V, an error signal F1 is output. These signal relations are represented in FIG. 3.

The arrangement of the two partial areas A and B of each code element C1, C2, C3 sequentially directly next to each other in the measuring direction X has the advantage that the detector elements D1 to D11 can be arranged next to each other at a small distance in the measuring direction X, so that therefore the position measuring device is insensitive to twisting of the detector unit D with respect to the code C, i.e. to Moiré fluctuations. Moreover, the sensitivity against interference because of dirt is low, since it can be assumed that both partial areas A and B of a code element C1, C2, C3 are equally affected.

In connection with the example of the detector elements D1 and D2 it is easy to see in FIG. 1 that, in the course of a displacement of the code C by the length of a partial area A, B toward the left, the detector element D1 scans the partial area C1B, and the detector elements D3 the partial area C2A, i.e. partial areas of two code elements C1, C2. Thus the trigger module T1 cannot provide binary information B1, B2, B3 assigned to a code element C1, C2, C3. In what follows, steps will be explained by which it can be assured that the correct detector elements D1 to D11 are used for creating code words, i.e. those detector elements D1 to D11 which respectively scan the partial areas of a single code element C1, C2, C3.

Figure 4:
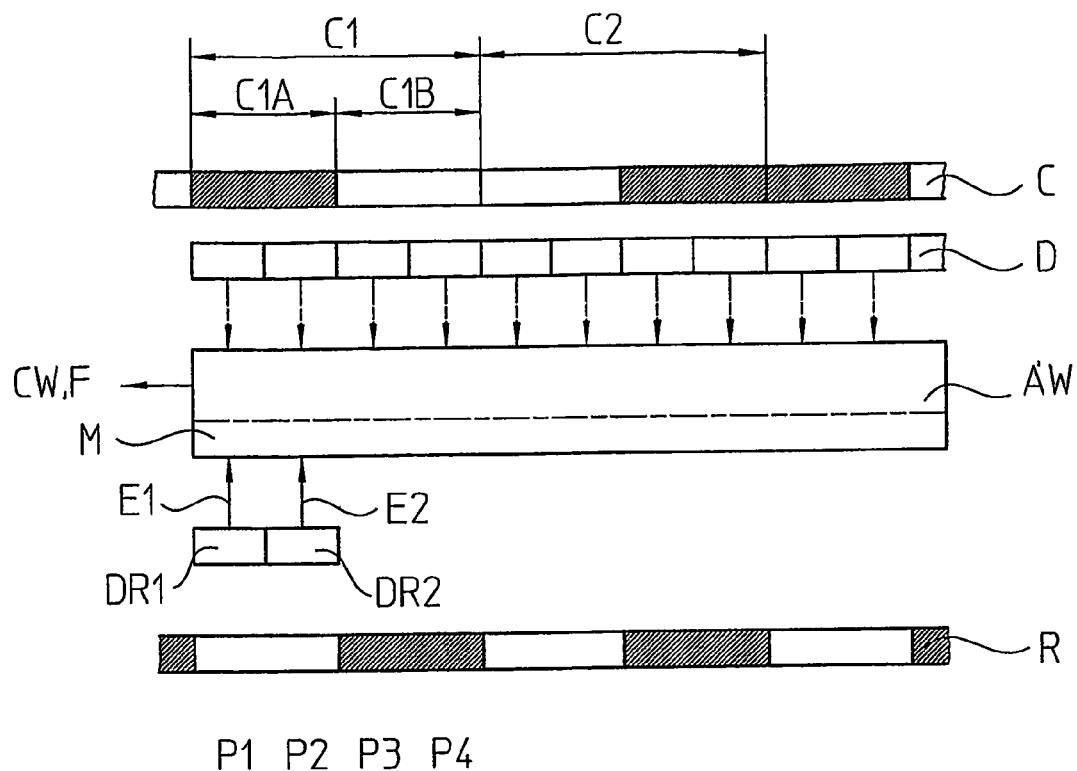
FIG. 4 shows an embodiment of a position measuring device with an incremental track for generating control signals in accordance with the present invention.
Figure 5A:
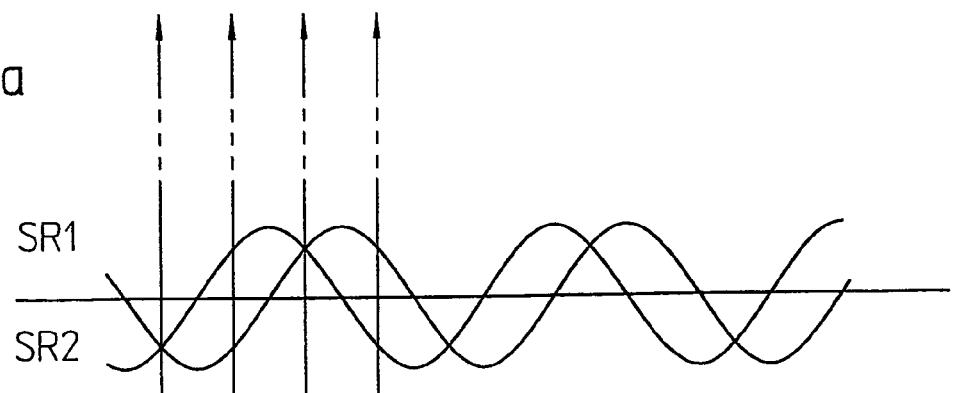
FIG. 5a shows possible analog scanning signals from the incremental track of FIG. 4.
Figure 5B:
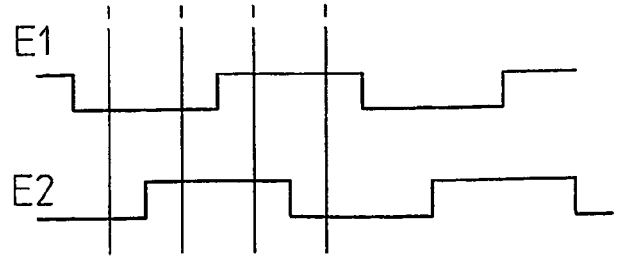

A preferred method for this is described by FIGS. 4 to 6. In accordance with FIG. 4, an incremental track R with a periodic graduation of the period length corresponding to the length of a code element C1, C2, C3 is arranged parallel next to the code C. In a known manner, the incremental track R is scanned by at least two detector elements DR1, DR2, which are offset with respect to each other in the measuring direction X by ¼ graduation period, for generating two analog scanning signals SR1, SR2, which are phase-shifted with respect to each other by 90°. These analog scanning signals SR1, SR2 are interpolated in a known manner, and the interpolated position value is combined with the code word CW, so that the rough absolute position measurement is refined by the high-resolution incremental measurement.

The length of each code element C1, C2, C3 is interpolated by the incremental measurement. A differentiation between the right and the left partial area of a code element C1, C2, C3 is now possible in a simple manner by the interpolation value. A quadruple interpolation, i.e. a one-time triggering of the analog scanning signals SR1, SR2 is sufficient for differentiating the partial areas A and B. The bit combination from the digital signals E1, E2 obtained from this defines the sequence of the partial areas A, B unequivocally, and it is used as the control signal for determining the detector element D1 to D11 from which a correct code word CW can be created. Thus, the digital signals E1, E2 define which scanning signals S must be compared with each other, and from which scanning signals S it is possible to obtain digital values B1, B2, B3 for the code word CW.

Four different positions P1, P2, P3, P4 of the code C with respect to the detector unit D are represented in FIGS. 6a to 6d for the further explanation of this method. The detector elements D1 to D11 are arranged in the measuring direction X at distances corresponding to half the length of a partial area A, B, and respectively two of the detector elements D1 to D11 arranged at a mutual distance corresponding to the length of a partial area A, B are differentially connected.

Figure 6A:
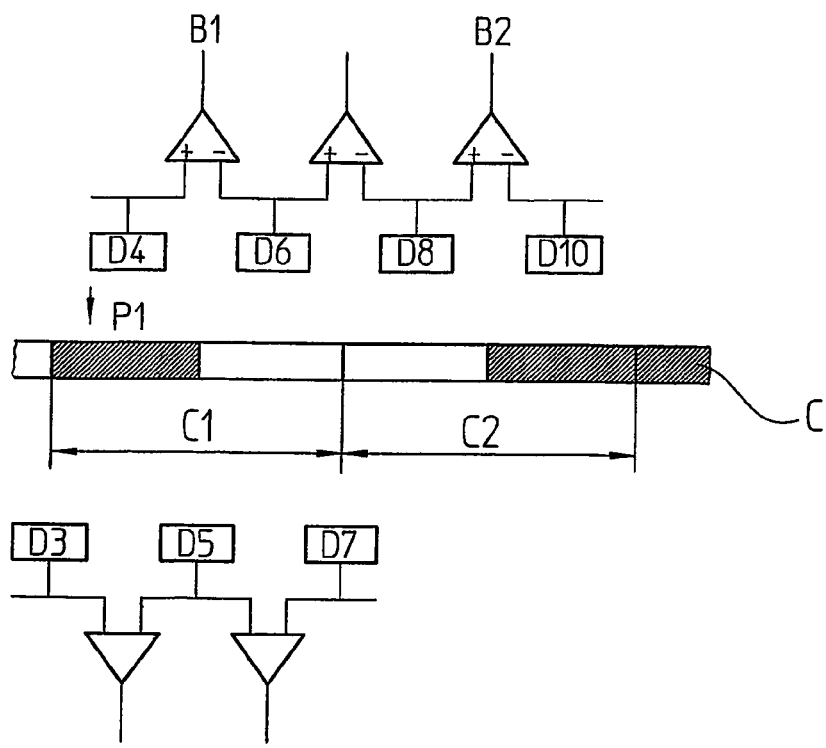
FIG. 6a shows a first scanning position of the position measuring device of FIG. 4.
Figure 6B:
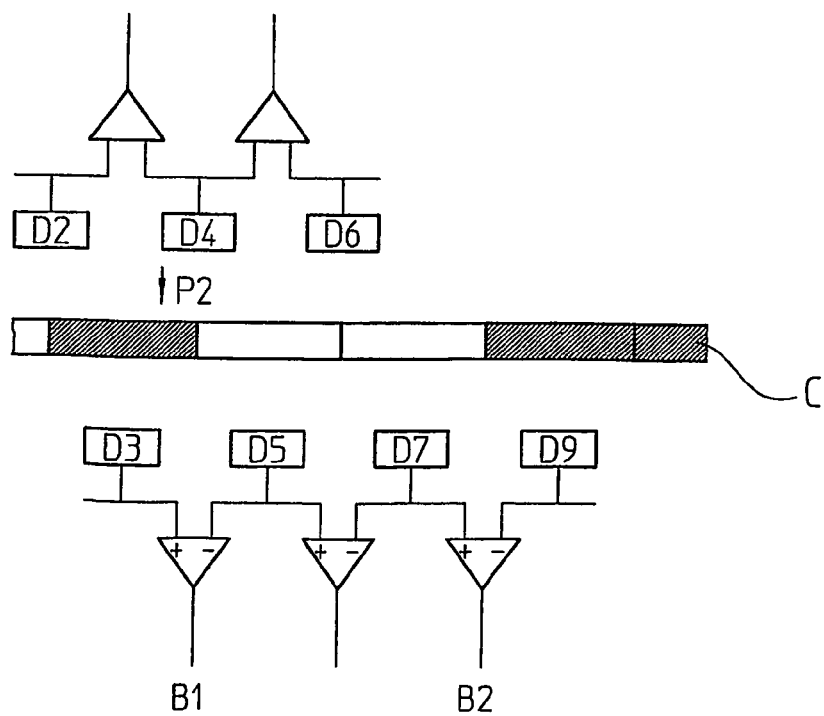
FIG. 6b shows a second scanning position of the position measuring device of FIG. 4.
Figure 6C:
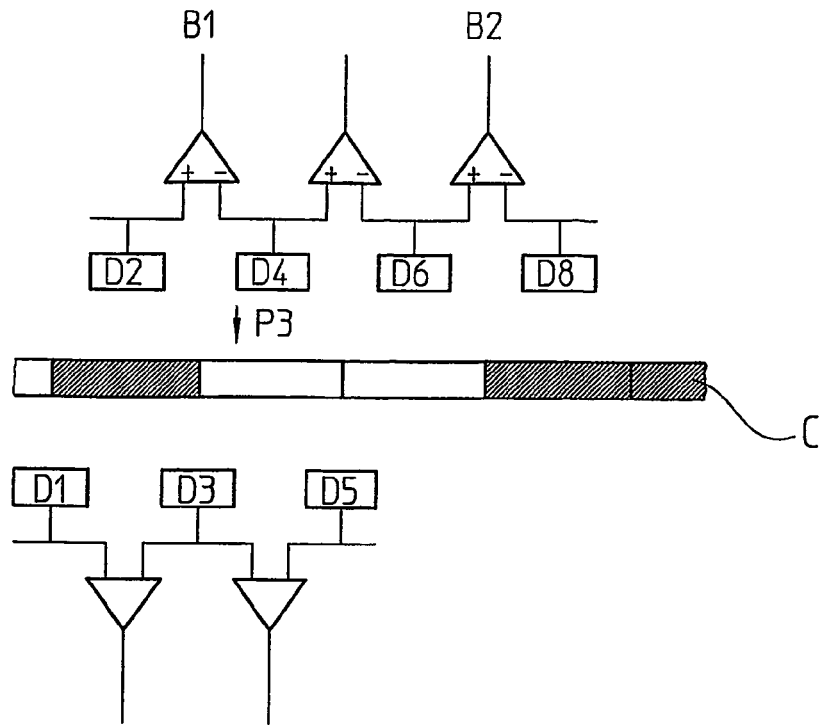
FIG. 6c shows a third scanning position of the position measuring device of FIG. 4.

The position P1 is represented in FIG. 6a, in which the information E1=0 and E2=0 is obtained from the incremental track R. The bit B1 of the code element C is formed by forming the difference from the detector elements D4 and D6, i.e. (D4–D6). At the position P2 in accordance with FIG. 6b, E1=0 and E2=1, so that the detector elements D3 and D5 are selected by a control unit M. At the position P3 in accordance with FIG. 6c, E1=1 and E2=1, so that the detector elements D2 and D4 are selected by the control unit M for forming the difference. At the position P4 in accordance with FIG. 6d, E1=1 and E2=0, so that the detector elements D1 and D3 are selected.

The correct detector elements for forming further bits of the code word CW are determined in the same way. If, for example, the detector elements D1 and D3 were selected for forming the bit B1, the detector elements D5 and D7 are used for forming the bit B2, and the detector elements D9 and D11 for forming the bit B3, as represented in FIG. 1. Wherein in FIG. 1 only the trigger modules T1, T2, T3 are represented, which are used in this momentary position.

Figure 6D:
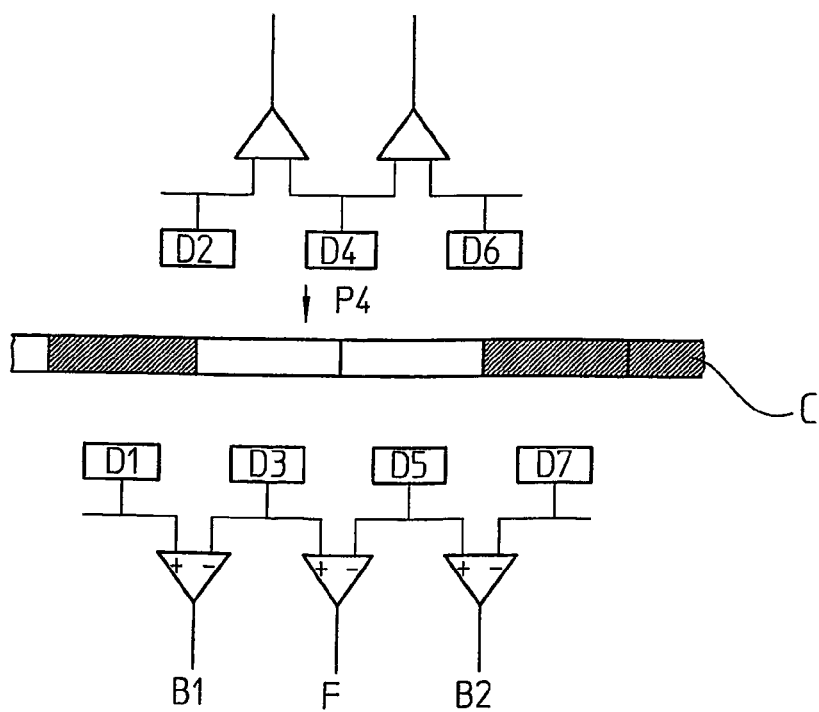
FIG. 6d shows a fourth scanning position of the position measuring device of FIG. 4.

A further possibility for determining the correct detector elements D1 to D11, or the correct analog scanning signals S, includes that all detector elements D1 to D11, which are spaced apart from each other at the distance of the length of a partial area A, B, are compared with each other. At the distance of a code element C1, C2, C3 there are the detector pairs D1, D3 and D5, D7—in accordance with the example of the momentary position P4 represented in FIG. 6d—each of which scans in a desired manner the difference of the partial areas A, B of a code element C1, C2. The further detector pairs D3, D5 scan successive partial areas A, B of two successive code elements C1, C2, and in this way create an error signal F1 by the error check device P explained by FIG. 2. Now, for determining the correct detector elements D1 to D11, a search is made for the detector group D1, D3, D5, D7 in which error signals F occur the least. In detail, for performing this second possible method the following arrangement, or the following method steps, is/are required:

detector elements D1 to D11 are arranged in the measuring direction X at distances corresponding to half the length of a partial area A, B, the detector elements D1 to D11 form a first group (the even-numbered detector elements D2, D4, D6, D8, D10 in FIGS. 6a to 6d) at a mutual distance corresponding to the length of a partial area A, B, the detector elements D1 to D11 form a second group (the odd-numbered detector elements D1, D3, D5, D7, D9) at a mutual distance corresponding to the length of a partial area A, B, the detector elements D2, D4, D6, D8, D10 of the first group are arranged offset by half the length of a partial area A, B with respect to the detector elements D1, D3, D5, D7, D9 of the second group, detector elements of a group immediately following each other are respectively differentially connected, the results of the comparison of those pairs of detector elements of the two groups are now used in a pattern corresponding to the length of a code element C1, C2, C3 for forming the code word CW, whose sequence generates the least errors F, thus, in accordance with FIG. 6d, the sequence (D1–D3)=B1, (D5–D7)=B2, etc.

the detector elements D1 to D11 form a second group (the odd-numbered detector elements D1, D3, D5, D7, D9) at a mutual distance corresponding to the length of a partial area A, B, the detector elements D2, D4, D6, D8, D10 of the first group are arranged offset by half the length of a partial area A, B with respect to the detector elements D1, D3, D5, D7, D9 of the second group, detector elements of a group immediately following each other are respectively differentially connected, the results of the comparison of those pairs of detector elements of the two groups are now used in a pattern corresponding to the length of a code element C1, C2, C3 for forming the code word CW, whose sequence generates the least errors F, thus, in accordance with FIG. 6d, the sequence (D1–D3)=B1, (D5–D7)=B2, etc.

The two partial areas A, B of each code word C1, C2, C3 can be embodied to be optically scannable, wherein then one partial area A is embodied transparent or reflecting the scanning light, and the other partial area B opaque or non-reflecting. However, the present invention is not limited to the optical scanning principle.

The absolute position measuring device can be employed for measuring linear or rotary movements, wherein the code C is applied to one of the movable objects, and the scanning device AE to the other of the movable objects. In this case the code C can be applied directly to the object to be measured, or on a scale which in turn is coupled with the object to be measured.

Here, the objects to be measured can be the table and the carriage of a machine tool, of a coordinate-measuring machine, or the rotor and the stator of an electric motor.

Further embodiment variations of the method in accordance with the present invention of course exist besides the explained example.

We claim:

1. A position measuring device, comprising:
 a code comprising a first code element and a second code element arranged one behind the other in a measuring direction, wherein each of said first and second code elements comprises a first partial area and a second partial area, which are complementary to each other and are arranged sequentially in said measuring direction;

a scanning device comprising a plurality of detector elements that scan said first and second code elements and for forming a first scanning signal within said first partial area of said first code element and a second scanning signal within said second partial area of said first code element; and an evaluation unit comprising a comparison device, which compares said first scanning signal with said second scanning signal and forms binary information for said first code element as a function of said comparison.

2. The position measuring device in accordance with claim 1, wherein said comparison device forms a difference between said first scanning signal and said second scanning signal.

3. The position measuring device in accordance with claim 2, wherein said first and second scanning signals are each conducted to said comparison device, and said evaluation unit comprises a control unit, which is designed to assure that said binary information is respectively formed from said first and second partial areas of said first code element.

4. The position measuring device in accordance with claim 2, wherein said evaluation unit comprises an error check device, which is designed for comparing said difference between said first and second scanning signals with a nominal difference and, in case of said difference falling below said nominal difference said error check device outputs an error signal.

5. The position measuring device in accordance with claim 1, wherein said first and second scanning signals are each conducted to said comparison device, and said evaluation unit comprises a control unit, which is designed to assure that said binary information is respectively formed from said first and second partial areas of said first code element.

6. The position measuring device in accordance with claim 5, further comprising a track arranged parallel with said code, wherein information of said track is supplied to said control unit, and wherein on the basis of said information of said track said first and second scanning signals are selected for forming said binary information.

7. The position measuring device in accordance with claim 6, wherein said information track is a periodic incremental graduation.

8. The position measuring device in accordance with claim 1, wherein said first and second partial areas have optical properties which are complementary to each other.

9. The position measuring device in accordance with claim 1, wherein said plurality of detector elements arc arranged in said measuring direction at distances corresponding to half length of said first partial areas of said first and second code elements, and respectively two of said plurality of detector elements are arranged at a mutual distance corresponding to said length of a partial area and are differentially connected.

10. A method for absolute position measuring, comprising:

scanning a code comprising a first code element and a second code element arranged one behind the other in a measuring direction, wherein each of said first and second code elements comprises a first partial area and a second partial area, which are complementary with respect to each other and are arranged following each other in said measuring direction;

generating a first scanning signal within said first partial area of said first code element and a second scanning signal within said second partial area of said first code element;

comparing said first and second scanning signals with each other; and forming binary information from said comparing.

11. The method in accordance with claim 10, wherein said comparing comprises forming a difference of said first and second scanning signals.

12. The method in accordance with claim 11, wherein said first and second partial areas of said first code element are immediately successive;

said method further comprising selecting said first and second scanning signals.

13. The method in accordance with claim 11, wherein said difference is compared with a nominal difference, and forming an error signal in case said difference falls below said nominal difference.

14. The method in accordance with claim 10, wherein said first and second partial areas of said first code element are immediately successive;

said method further comprising selecting said lust and second scanning signals.

15. The method in accordance with claim 14, wherein said selecting takes place via a control signal obtained by scanning at least one information track.

16. The method in accordance with claim 10, wherein said plurality of detector elements are arranged in said measuring direction at distances corresponding to half a length of said first partial areas of said first and second code elements, and wherein said difference is formed from two of said plurality of detector elements which are arranged at a mutual distance from each other corresponding to said length of said first partial areas of said first and second code elements.

17. The method in accordance with claim 16, wherein said difference is compared with a nominal difference; and forming an error signal when said difference falls below said nominal difference; and said binary information is selected in a pattern corresponding to a length of said first code element for forming the code word CW, whose sequence generates the least errors.

* * * * *